United States Patent
Nagaraj et al.

(10) Patent No.: US 11,901,910 B2
(45) Date of Patent: *Feb. 13, 2024

(54) SUCCESSIVE APPROXIMATION REGISTER ANALOG TO DIGITAL CONVERTER

(71) Applicant: TEXAS INSTRUMENTS INCORPORATED, Dallas, TX (US)

(72) Inventors: Krishnaswamy Nagaraj, Plano, TX (US); Joonsung Park, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/862,455

(22) Filed: Jul. 12, 2022

(65) Prior Publication Data

US 2022/0345145 A1  Oct. 27, 2022

Related U.S. Application Data

(63) Continuation of application No. 17/137,691, filed on Dec. 30, 2020, now Pat. No. 11,387,837.

(51) Int. Cl.
 *H03M 1/00* (2006.01)
 *H03M 1/46* (2006.01)

(52) U.S. Cl.
 CPC ..................... *H03M 1/46* (2013.01)

(58) Field of Classification Search
 CPC ........ H03M 1/462; H03M 1/46; H03M 1/466; H03M 1/468; H03M 1/38; H03M 1/002; H03M 1/1009; H03M 1/363; H03M 1/12; H03M 1/124; H03M 3/458; H03M 1/06; H03M 1/08; H03M 1/442; H03M 1/069; H03M 1/1023; H03M 1/804; H03M 1/0626; H03M 1/0863

USPC ................ 341/118, 120, 122, 155, 161, 172
See application file for complete search history.

(56) References Cited

U.S. PATENT DOCUMENTS

| | | | |
|---|---|---|---|
| 6,801,151 B1 * | 10/2004 | Opris | H03M 1/442 341/161 |
| 9,252,800 B1 * | 2/2016 | Park | H03M 1/20 |
| 10,003,348 B2 * | 6/2018 | Liu | H03M 1/08 |
| 10,135,454 B2 * | 11/2018 | Durston | H03M 1/0658 |
| 10,177,779 B2 | 1/2019 | Lee et al. | |
| 10,284,213 B2 * | 5/2019 | Bandyopadhyay | H03M 1/0854 |
| 10,469,095 B2 | 11/2019 | Lin et al. | |
| 10,965,300 B1 * | 3/2021 | Weng | H03M 1/0612 |
| 11,387,837 B1 * | 7/2022 | Nagaraj | H03M 1/46 |
| 2011/0001492 A1 | 1/2011 | Nys et al. | |
| 2011/0234433 A1 | 9/2011 | Aruga et al. | |
| 2012/0326901 A1 * | 12/2012 | Zhao | H03M 1/06 341/172 |
| 2013/0106629 A1 * | 5/2013 | Nys | H03M 1/144 341/110 |

(Continued)

OTHER PUBLICATIONS

International Search Report for PCT/US2021/065612 dated Apr. 7, 2022.

*Primary Examiner* — Linh V Nguyen
(74) *Attorney, Agent, or Firm* — Krista Y. Chan; Frank D. Cimino

(57) ABSTRACT

A successive approximation analog-to-digital with an input for receiving an input analog voltage, and an amplifier with a first set of electrical attributes in a sample phase and a second set of electrical attributes, differing from the first set of electrical attributes, in a conversion phase.

20 Claims, 3 Drawing Sheets

(56) References Cited

U.S. PATENT DOCUMENTS

| | | | |
|---|---|---|---|
| 2013/0321053 A1 | 12/2013 | Bogner et al. | |
| 2014/0070976 A1 | 3/2014 | Hurrell et al. | |
| 2014/0184435 A1 | 7/2014 | Wang et al. | |
| 2015/0091746 A1 | 4/2015 | Wang | |
| 2016/0352351 A1* | 12/2016 | Miki | H03M 1/0626 |
| 2017/0012633 A1 | 1/2017 | Venca et al. | |
| 2017/0012637 A1* | 1/2017 | Venca | H03M 1/462 |
| 2017/0317683 A1* | 11/2017 | Bandyopadhyay | H03M 3/426 |
| 2018/0183454 A1 | 6/2018 | Lee et al. | |
| 2018/0309450 A1 | 10/2018 | Yagishita | |
| 2019/0207620 A1* | 7/2019 | Lee | H03M 3/494 |
| 2021/0359698 A1* | 11/2021 | Sun | H03M 1/38 |

\* cited by examiner

SUCCESSIVE APPROXIMATION REGISTER ANALOG TO DIGITAL CONVERTER

CROSS-REFERENCE TO RELATED APPLICATION

This application is a continuation of U.S. patent application Ser. No. 17/137,691, filed Dec. 30, 2020, which is incorporated by reference herein in its entirety.

BACKGROUND

The example embodiments relate to analog-to-digital converters (ADC singular, ADCs plural) and, more particularly, to successive approximation register (SAR) ADCs.

A SAR ADC converts an analog input voltage signal to a digital output value, sometimes referred to as a code, by successively comparing the input to an internally-generated and changing reference voltage. For each successive comparison, the reference voltage is adjusted to converge toward the value of the analog input voltage signal, while each such adjustment and comparison determines a respective bit of the SAR ADC output code. Further, as the differential between the input and reference voltage thus converges, the reference voltage change is smaller in each successive comparison, and the smaller reference voltage and differential is therefore more susceptible to error.

A SAR ADC is typically embodied as, or part of, an integrated circuit (IC). Accordingly, typical IC design considerations are factors for the SAR ADC, such as area and power consumed by the device. Further, as SAR ADCs have advanced, for example operating at higher speed and with a greater number of output bits, additional design considerations are directed to output accuracy. For example, noise impacts the SAR ADC input signal, its components that process the input signal, and the proper assessment of the converging differential between the input signal and reference voltage. Accordingly, noise effects may be considered to the extent those can cause a signal state change greater than the least significant bit (LSB) resolution of the device, that is, potentially producing an error in the output or limiting the resolution of the output code.

While the preceding considerations are generally common to most SAR ADCs, different designers may prioritize different design considerations, for example considering different sources of noise and designs to mitigate nose effects. Accordingly, example embodiments are provided in this document that may improve on various of such noise considerations as well as other concepts, as further described below.

SUMMARY

A successive approximation analog-to-digital converter an input for receiving an input analog voltage. The converter further comprises sample phase circuitry comprising an amplifier and for providing the amplifier with a first set of electrical attributes and for sampling the input analog voltage in a sample phase, and conversion phase circuitry comprising the amplifier and for providing the amplifier with a second set of electrical attributes differing from the first set of electrical attributes and for converting a comparison, of the sampling of the input analog voltage relative to a reference voltage, to a digital value in a conversion phase.

Other aspects are also disclosed and claimed.

DETAILED DESCRIPTION

Figure 1:
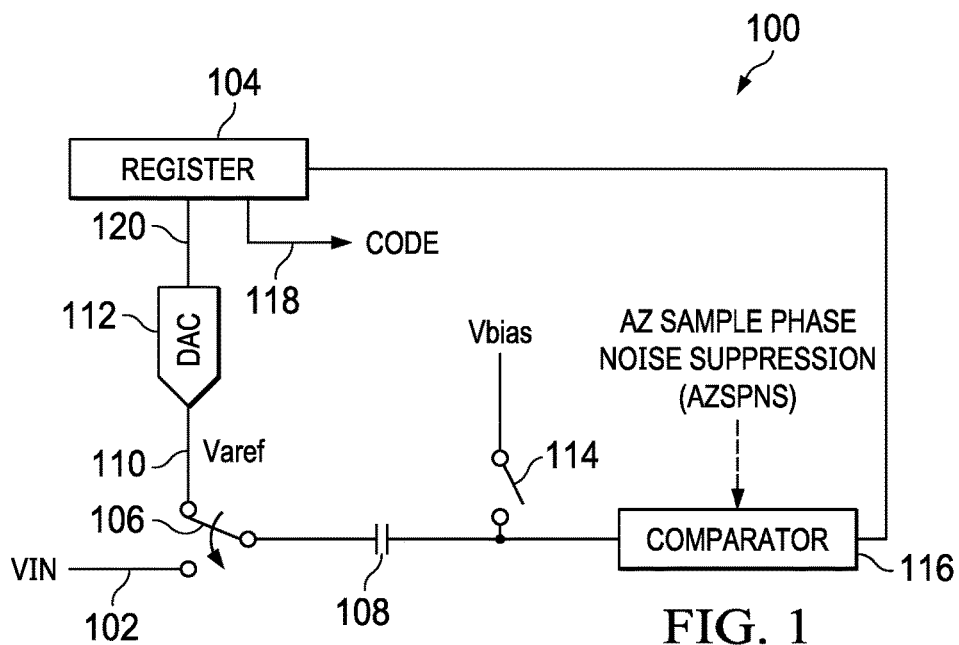
FIG. 1 illustrates a schematic of an example embodiment SAR ADC.

FIG. 1 illustrates a schematic of an example embodiment SAR ADC 100. SAR ADC receives an analog input voltage VIN at an input node 102 and ultimately produces, in an N-bit register 104, a CODE corresponding to the magnitude of VIN. Particularly, VIN is connected to the input node 102, which is a first of two switch throws of an input switch 106. The input switch 106 has a pole connected to a first plate of a sample capacitor 108, and the input switch 106 has a second throw connected to an output node 110 of a digital-to-analog converter (DAC) 112. A second plate of the sampling capacitor 108 is connected to a throw of a first bias switch 114, and the throw of the first bias switch 114 is connected to receive a bias voltage Vbias through the first bias switch 114. The throw of the first bias switch 114 also is connected as an input to a comparator 116. The output of the comparator 116 is connected to the register 104. A first output 118 of the register 104 provides the CODE output once the SAR ADC 100 completes its conversion of VIN, and a second output 120 of the register 104 provides the CODE output, as it is being determined in its entirety, to the input of the DAC 112. It is noted that the capacitance of the sampling capacitor 108 may be implemented as part of the same capacitor, or capacitive element(s), as the DAC 112, although for sake of simplification in this document those are shown as separate structures. It is further noted that the illustrated switches (including the input switch 106 and the first bias switch 114) are functional representations that may be implemented using a variety of circuit elements, such as transistors.

The general operation of the SAR ADC 100 is as follows, with additional structural and operational details provided later. The SAR ADC 100 in a first phase samples VIN and then in a second phase performs conversion by iteratively comparing the sampled VIN to different internally-generated reference voltages, provided from the DAC 112. Transitions between the sample phase and iterative conversion phase are executed in part by the input switch 106 and the first bias switch 114, as described later. Further, the overall SAR ADC 100 operation is improved by implementing into the sample phase an auto zeroing (AZ) sample phase noise suppression (AZSPNS) aspect, shown generally in FIG. 1 as a control input to the comparator 116 and also described later. Together, the sample phase and one or more iterative conversion phases determine a successive bit stored in the N-bit register 104, where completion of all iterations completes the total number of N bits in the register 104 as the CODE at the output 118. For example, VIN is sampled in a sample phase and then in a first iteration of the conversion phase, the sample VIN is compared, by the comparator 116, to an analog reference voltage Varef, where Varef is output by the DAC 112 in response to a CODE then in the register 104. For instance, in the first iteration of the conversion phase, the most significant bit (MSB) of the N-bit value in the register 104 is set high, while all lesser significant bits in the register 104 are low. So, in this conversion phase first iteration, the SAR ADC 100 compares VIN to the voltage Varef which corresponds to the MSB-high value in the N-bit register 104. If VIN is greater in that comparison, then the MSB is left (or overwritten) high and the next lesser significant bit is set for the next conversion phase iteration. If VIN is lesser in that comparison, then the MSB is zeroed and the next lesser significant bit is set for the next conversion phase iteration. The above process repeats for each successive iteration, until all N bits in the N-bit register 104 have been set to establish a corresponding Varef that is compared to VIN as has been described. Upon completion of all iterations, the N-bit value in the N-bit register 104 is output as the CODE and is representative of the magnitude of VIN.

Figure 2:
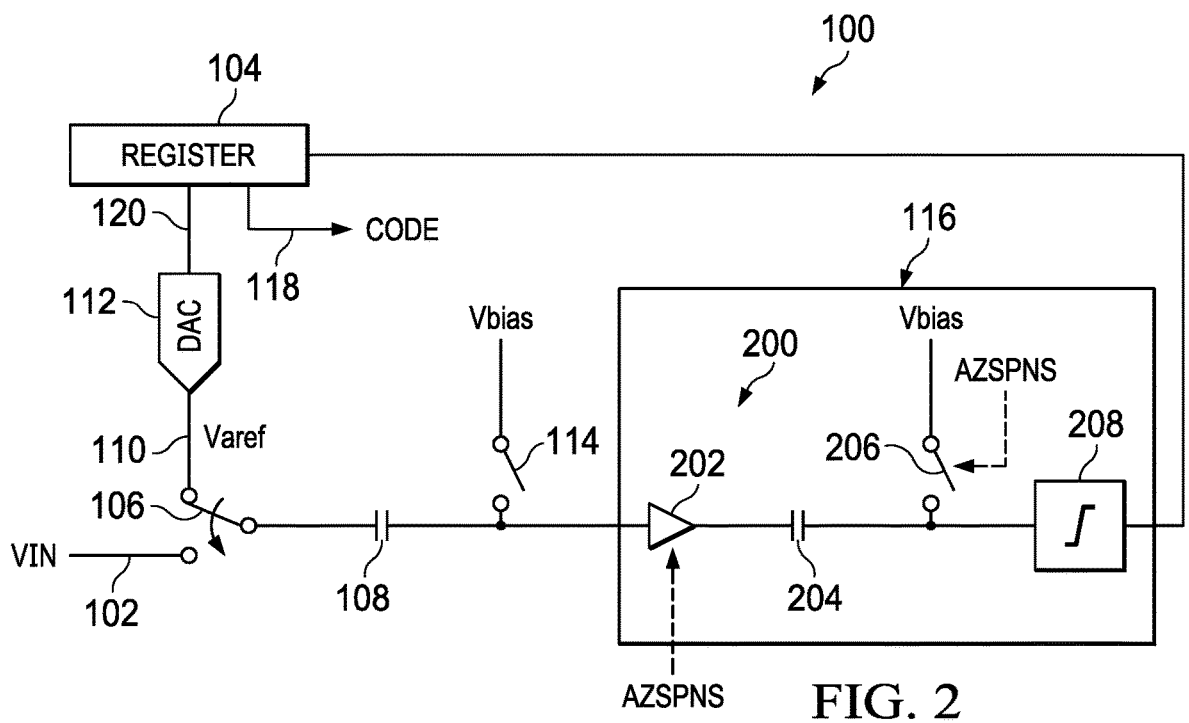
FIG. 2 illustrates a schematic of the FIG. 1 SAR ADC with additional details shown for the FIG. 1 comparator.

FIG. 2 illustrates a schematic of the SAR ADC 100, with additional details shown for the comparator 116. The comparator 116 includes an amplification stage 200, which by way of example is shown to include a single amplifier 202. The amplifier 202 is shown to receive AZSPNS, as the electrical attributes of the amplifier 202 are selectively adjusted as described later, for example to be different during the sample phase as compared to the conversion phase, where the adjustment further improves the AZ performance of the SAR ADC 100. An input of the amplifier 202 is connected to the throw of the first bias switch 114, and an output of the amplifier 202 is connected to a first plate of an AZ capacitor 204. The second plate of the AZ capacitor 204 is connected to a throw of an AZ switch 206. The AZ switch 206 pivots in the direction shown, by an AZSPNS arrow, during sample phase auto zeroing. The pole of the AZ switch 206 is connected to Vbias. The throw of the AZ switch 206 also is connected as an input to a latch 208. An output of the latch 208 is the output of the comparator 116 and, as introduced earlier, is connected to the N-bit register 104. The latch 208 may operate as a threshold detector, so that if its input is below a threshold, then the latch output is a logic low, or if its input is above that threshold then the latch output is a logic high. Alternatively, the amplifier 202 may consist of multiple capacitively coupled stages connected in cascade, with each stage having an AZ switch at its input. The coupling capacitor of the last of these cascaded stages is connected to the input of the latch 208.

Figure 3:
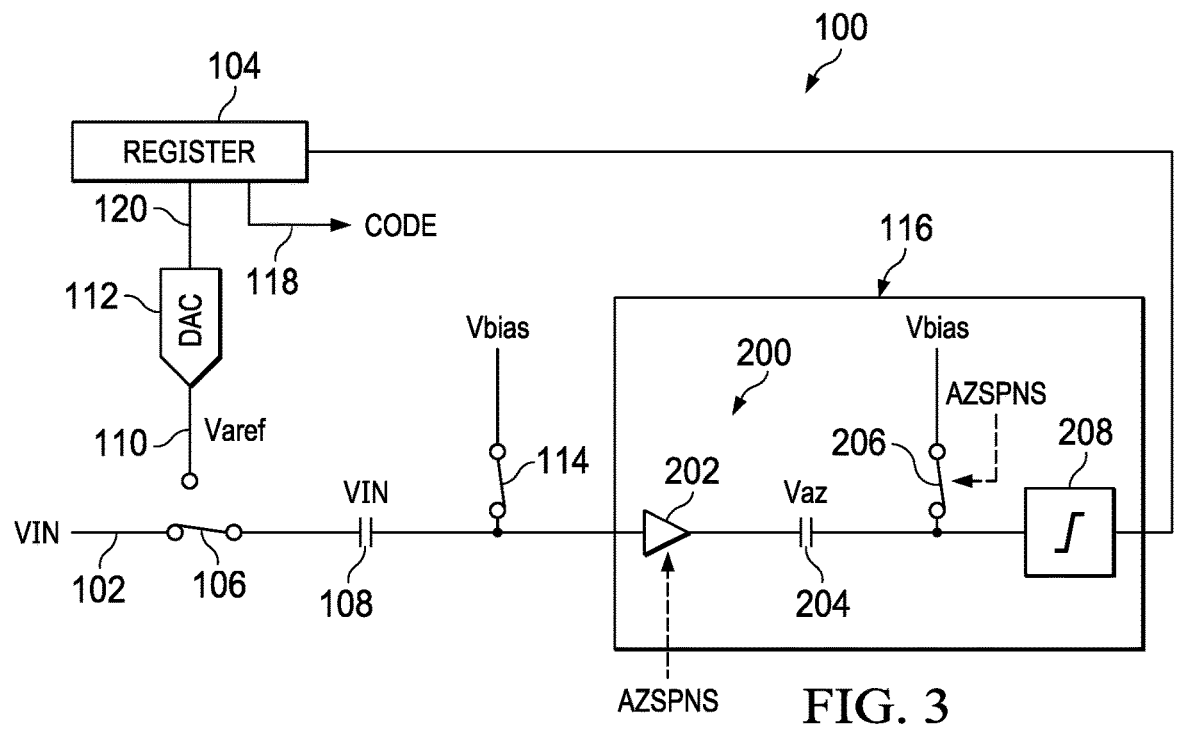
FIG. 3 illustrates the FIG. 2 schematic of the SAR ADC 100, with its three switches positioned to operate in the sample phase.

FIG. 3 illustrates the FIG. 2 schematic of the SAR ADC 100, with its three switches positioned to operate in the sample phase. In the sample phase, two different voltages are sampled and stored on respective capacitors. Specifically, the input switch 106 connects VIN to the first plate of the sampling capacitor 108, while the first bias switch 114 connects Vbias both to amplifier 202 (or multiplier amplifiers, if applicable) and to the second plate of the sampling capacitor 108, thereby providing a low impedance to that capacitor plate. Thus, Vbias serves the dual purpose of biasing the amplifier 202 and providing a low impedance to the capacitor 108. Accordingly, VIN is sampled to the sampling capacitor 108. AZSPNS is also asserted during the sample phase, to position (close) the AZ switch 206 and to control the amplifier 202, the latter selectively adjusting electrical attributes during the sample phase to further improve noise immunity, as described later. Particularly, during the sample phase, the AZSPNS-controlled amplifier 202 outputs an AZ voltage Vaz to the first plate of the of the AZ capacitor 204 that, with the AZ switch 206 closed and thereby connecting the low impedance of Vbias to the second plate of that capacitor, then Vaz is sampled to that AZ capacitor 204. The closed AZ switch 206 also connects Vbias to the input of the latch 208, to bias the input of the latch 208 for correct operation during the conversion phase. By virtue of the fact that the input of the amplifier 202 is connected to a constant voltage Vbias during the sampling phase, Vaz represents the offset plus noise of the amplifier 202.

Figure 4:
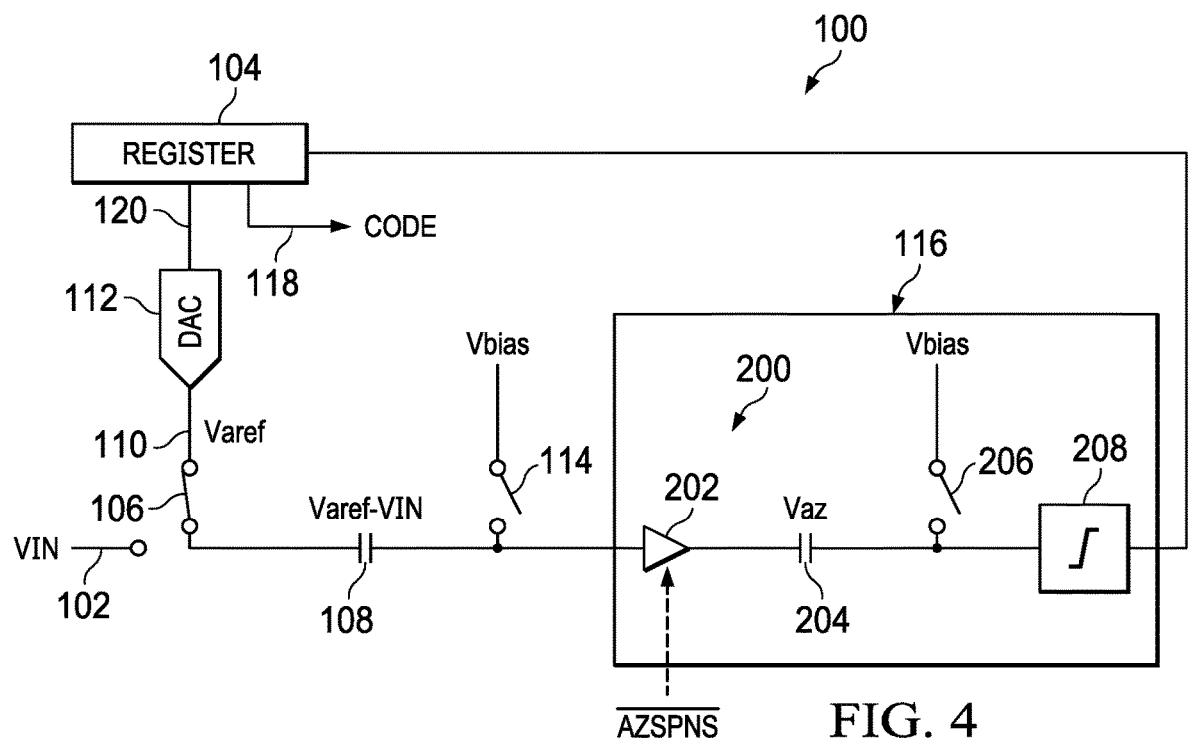
FIG. 4 illustrates the FIG. 2 schematic of the SAR ADC 100, with its three switches positioned to operate in the conversion phase.

FIG. 4 illustrates the FIG. 2 schematic of the SAR ADC 100, with its three switches positioned opposite to that in FIG. 3, so that in FIG. 4 the SAR ADC 100 operates iteratively in the conversion phase. In the conversion phase, the input switch 106 connects the DAC 112 analog reference voltage Varef to the sampled voltage VIN already on the sampling capacitor 108 from the immediately-preceding sample phase. Accordingly, the difference of those two voltages, Varef-VIN, is input to the comparator 116 and thereby to its amplifier 202. Recalling from the above that in the first conversion phase iteration Varef is approximately one-half the voltage capacity of the DAC 112, then the difference provided by Varef-VIN is essentially a comparison of those two voltages, whereby if the difference is positive then Varef is larger than VIN, and if the difference is negative then VIN is larger than Varef. At the same time, AZSPNS is de-asserted, thereby selectively adjusting conversion phase electrical attributes of the amplifier 202 to differ from those of the sample phase. Accordingly, the amplifier 202 operates under the conversion phase electrical attributes to output a voltage G(VIN-Vref), where G is the gain of the amplifier 202 and (VIN-Vref) is the input voltage to the amplifier 202. The output voltage G(VIN-Vref) is coupled to the AZ capacitor 204, which recall in the preceding sample phase stored an AZ voltage, Vaz. Accordingly, in the conversion phase, Vaz is subtracted from G(VIN-Vref), thereby essentially zeroing the effect that the offset and noise of the amplifier 202 otherwise would have on the operation of the SAR ADC 100. Further, the differential voltage (G(VIN-Vref)-Vaz) from the AZ capacitor 204 is connected to the input of the latch 208. The latch 208 outputs either a logic low or high based on whether (G(VIN-Vref)-Vaz) exceeds a threshold limit of the latch 208, and that logic value is written to the bit position in the N-bit register 104 that was originally high for the current conversion phase iteration.

The preceding description of the first conversion phase iteration of the SAR ADC 100 repeats so that in total N conversion phase iterations occur, each iteration corresponding to a respective bit in the N bits of the N-bit register 104. Accordingly, following the first iteration, N-1 successive iterations occur, where each iteration is for a next less significant bit in the N-bit register 104 and until all N bits in the register 104 have been processed through respective conversion phase iterations. At the completion of those operations, the N bits in the N-bit register 104 present a digital approximation of VIN, and are provided to the output 118 as the CODE.

Figure 5:
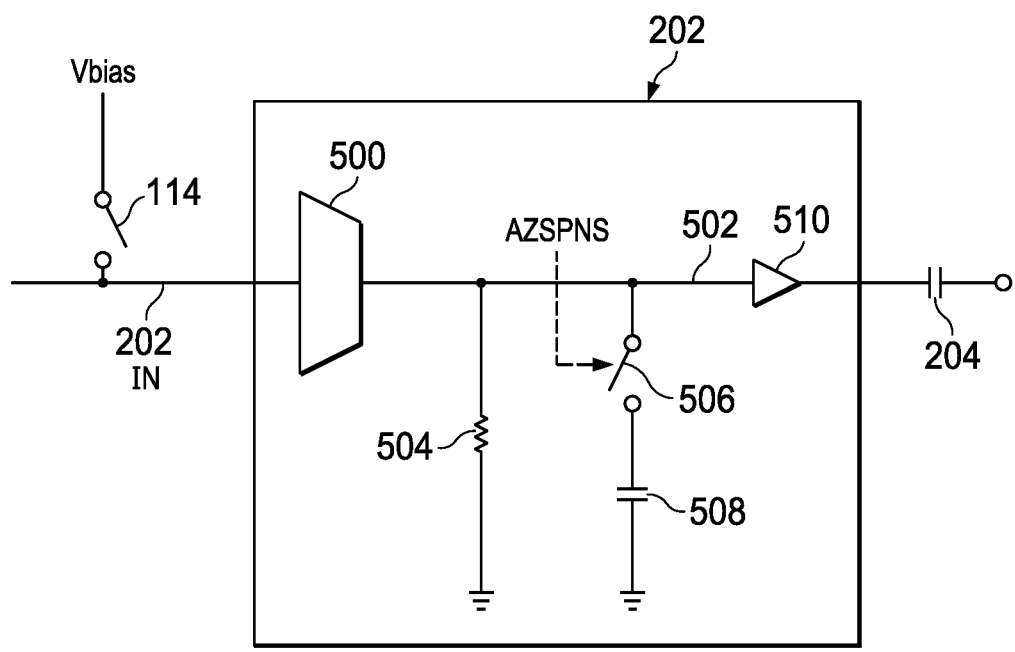
FIG. 5 illustrates a schematic of the SAR ADC amplifier 202 with greater detail elaborating on selective adjustment of the amplifier electrical attributes to be different during the sample phase versus the conversion phase.

FIG. 5 illustrates a schematic of the amplifier 202 (FIGS. 2-4) in greater detail, further elaborating on an example embodiment for the structure for, and method of operation of, the selective adjustment of the amplifier 202 electrical attributes to be different during the sample phase versus the conversion phase. For reference to prior Figures, FIG. 5 also includes, outside of the amplifier 202, the first bias switch 114 and the AZ capacitor 204. The throw of the first bias switch 114 is connected to the input of 202IN of the amplifier 202. The input 2021N is connected to an input of a transconductor 500, which in conjunction with a resistor 504, provides the earlier-introduced gain G. The output of the transconductor 500 is connected to a node 502. The node 502 is connected through the resistor 504 to ground. The node 502 is also connected to a pole of a noise-suppression switch 506. The noise-suppression switch 506 closes during sample phase auto zeroing when AZSPNS is asserted (and opens when de-asserted). The throw of the noise-suppression switch 506 is connected through a capacitor 508 to ground. The node 502 is also connected to the input of a zero-unity buffer 510, and the output of the zero-unity buffer 510 provides the output of the amplifier 202.

The operation of the FIG. 5 amplifier 202 in general is described earlier, with additional discussion now regarding the selective adjustment of its electrical attributes during the sample phase versus the conversion phase.

During the sample phase, recall that AZ is concurrently implemented and AZSPNS is asserted. Accordingly in FIG. 5, during the sample phase, the capacitor 508 is connected through the noise-suppression switch 506 to the node 502, that is, in the amplifier output and in parallel with the resistor 504 to ground. With both the resistor 504 and the capacitor 508 connected to the output of the transconductance 500, the electrical attributes of the amplifier 202 are selectively adjusted, namely, the 3 dB cutoff corner of the amplifier 202 is reduced. Accordingly, the lower 3 dB cutoff corner reduces the amplifier bandwidth (excludes higher frequencies), as compared to an instance where the node 502 is not capacitively coupled to ground in this manner Relatedly, as known in the art, the transconductance of an amplifier (e.g., the transconductance 500) provides thermal noise. In the illustrated embodiment, however, the sample phase selectively-reduced bandwidth, provided here by including the capacitance of the capacitor 508 during the sample phase AZ operation, filters out a higher-frequency portion of the amplifier thermal noise. This in turn reduces the amount of thermal noise energy that otherwise would appear in Vaz (see FIGS. 3 and 4). Accordingly, with the FIG. 5 switched-in capacitance, Vaz is generated as and represents a thermal noise suppressed AZ voltage, that is buffered by the buffer 510 and then stored, as shown in FIG. 2, to the AZ capacitor 204.

As described above, a number N of conversion phase iterations follow the sample phase. In the conversion phase iterations, recall that AZSPNS is de-asserted, and as a result in FIG. 5 the noise-suppression switch 506 opens and the capacitor 508 is disconnected from the node 502, thereby increasing the bandwidth of the amplifier 202 and also allowing the conversion phase iterations to occur at a speed not reduced as it would be were the capacitor 508 part of the amplification output during that phase. Accordingly, the conversion phase proceeds as described earlier, with the improvement that the AZ functionality provided by the voltage Vaz, stored on the AZ capacitor 204, will offset the output of the amplifier 202 more favorably due to the noise suppression of reduced bandwidth during the immediately preceding sample phase. More particularly, traditional AZ is directed to either DC or relatively low frequency (e.g., 10 Hz or less, sometimes referred to as flicker) noise, which noise is relatively constant over relatively long periods of time, as compared to the sample rate of the SAR ADC which is typically on the order of hundreds of KHz to several MHz. Accordingly, such traditional AZ approaches may store such noise to an offset capacitor, which is then auto-zeroed in a subsequent phase. At the same time as the longer duration noise, however, higher frequency noise also can appear from thermal noise, and the long duration period of storing the traditional AZ offset can or will include the higher-frequency thermal noise, which indeed can be fairly inconsistent from phase to phase given the relatively high frequency nature of thermal noise, as compared to DC and flicker noise. In other words, the higher frequency thermal noise during sampling does not necessarily correlate to the same noise, and its offset, during conversion. The example embodiment, therefore, reduces the storage of high frequency noise during AZ by selectively adjusting the electrical attributes of the amplification stage 200 during AZ, thereby improving the signal-to-noise ratio (SNR) of the SAR ADC 100 when it switches to the conversion phase. Accordingly, device operation, such as data conversion accuracy, is improved.

From the above, example embodiments include an ADC, such as a SAR ADC, with improved performance from selectively adjusting the ADC electrical attributes during different ADC phase operations. The adjustment as performed desirably reduces the possible storage of higher frequency noise as part of the AZ offset voltage during the sample phase. Further, in an example embodiment, the selectively-adjusted electrical attribute includes changing the amplification stage bandwidth to differ in the ADC sample phase versus its conversion phase. Further, the selectively adjusted bandwidth may be accomplished by changing the amplification signal path capacitance to differ in the sample phase from that of the conversion phase, for example, by switching a capacitor in and out of the amplifier output signal path in the sample and conversion phase, respectively. Still further, in the example embodiment, the changed capacitance is implemented in a first amplifier of cascaded amplifiers if the amplification stage includes plural amplifiers, as the gain of the first amplifier is the most impactful if cascading through plural amplifiers. Further, while the above-described attributes are shown and described, also contemplated are changes in various parameters, including dimensions, with the preceding providing only some examples, with others ascertainable, from the teachings herein, by one skilled in the art. Accordingly, additional modifications are possible in the described embodiments, and other embodiments are possible, within the scope of the following claims.

What is claimed is:

1. A circuit device comprising:
   a comparator that includes:
   a transconductor that includes an input configured to couple to a sampling capacitor and includes an output;
   a switch coupled to the output of the transconductor;
   a first capacitor coupled to the switch and to a ground node;
   a second capacitor coupled to the output of the transconductor;
   a resistor coupled to the output of the transconductor and the ground node; and
   a level detector that includes an input coupled to the second capacitor.

2. The circuit device of claim 1, wherein:
   the switch is a first switch; and
   the comparator further includes a second switch coupled to the input of the level detector and to a bias voltage node.

3. The circuit device of claim 2, wherein the first switch and the second switch are configured to be in a closed state based on an auto-zero signal being asserted and an open state based on the auto-zero signal being de-asserted.

4. The circuit device of claim 1, wherein the comparator further includes a buffer that includes an input coupled to the output of the transconductor and includes an output coupled to second capacitor.

5. The circuit device of claim 1, wherein:
the switch is a first switch; and
the circuit device further comprises:
a voltage input;
a second switch coupled to the voltage input; and
the sampling capacitor coupled to the second switch.

6. The circuit device of claim 5, further comprising a reference voltage node coupled to the second switch.

7. The circuit device of claim 6, further comprising a digital-to-analog converter that includes an output coupled to the reference voltage node.

8. The circuit device of claim 7, wherein:
the digital-to-analog converter includes an input; and
the circuit device further comprises a register that includes an input coupled to the level detector and includes an output coupled to the input of the digital-to-analog converter.

9. A circuit device comprising:
a voltage input configured to receive an input voltage;
a digital-to-analog converter configured to provide a reference voltage;
a register coupled to the digital-to-analog converter;
a first switch coupled to the voltage input and the digital-to-analog converter;
a sampling capacitor coupled to the first switch; and
a comparator that includes:
a transconductor that includes:
an input coupled to the sampling capacitor; and
an output;
a second switch coupled to the output of the transconductor;
a first capacitor coupled to the second switch and to a ground node;
a second capacitor coupled to the output of the transconductor; and
a level detector that includes:
an input coupled to the second capacitor; and
an output coupled to the register,
wherein the first switch is configured to couple the input voltage to the sampling capacitor and the second switch is configured to couple the output of the transconductor to the first capacitor concurrently.

10. The circuit device of claim 9, wherein the comparator further includes a third switch coupled to a bias voltage node and to the input of the level detector, wherein the third switch is configured to couple the bias voltage node to the input of the level detector concurrent with the second switch coupling the output of the transconductor to the first capacitor.

11. The circuit device of claim 9, further comprising a third switch coupled to a bias voltage node and to the input of the transconductor, wherein the third switch is configured to couple the bias voltage node to the input of the transconductor concurrent with the second switch coupling the output of the transconductor to the first capacitor.

12. The circuit device of claim 9, wherein the comparator further includes a resistor coupled to the output of the transconductor and the ground node.

13. The circuit device of claim 9, wherein the comparator further includes a buffer that includes:
an input coupled to the output of the transconductor; and
an output coupled to second capacitor.

14. The circuit device of claim 9, wherein the first switch is configured to couple the reference voltage to the sampling capacitor and the second switch is configured to decouple the output of the transconductor from the first capacitor concurrently.

15. A method comprising:
performing a sampling phase of a successive approximation register digital-to-analog conversion that includes:
receiving an input voltage;
coupling the input voltage to a sampling capacitor that is coupled to an input of a transconductor; and
coupling a first capacitor to an output of the transconductor such that the first capacitor is coupled between the output of the transconductor and a ground node; and
performing a conversion phase of the successive approximation register digital-to-analog conversion that includes:
decoupling the first capacitor from the output of the transconductor; receiving a reference voltage;
coupling the reference voltage to the sampling capacitor; and
performing a comparison of a difference between the reference voltage and the input voltage using a level detector that includes an input coupled to the output of the transconductor by a second capacitor.

16. The method of claim 15, wherein the performing of the sampling phase further includes coupling a bias voltage to the input of the level detector.

17. The method of claim 16, wherein the performing of the sampling phase further includes coupling the bias voltage to the input of the transconductor.

18. The method of claim 15, wherein:
the performing of the conversion phase includes generating the reference voltage using a digital-to-analog converter based on a value stored in a register; and
the method further comprises updating the value stored in the register based on the comparison of the difference between the reference voltage and the input voltage.

19. The method of claim 18, further comprising providing a code representing a measurement of the input voltage based on the value stored in the register.

20. The circuit device of claim 1, wherein the first capacitor is directly coupled to ground.

* * * * *